US012640410B2

(12) United States Patent
Joos et al.

(10) Patent No.: US 12,640,410 B2
(45) Date of Patent: May 26, 2026

(54) BATTERY AND ENERGY SYSTEM INCLUDING SUCH A BATTERY

(71) Applicant: Robert Bosch GmbH, Stuttgart (DE)

(72) Inventors: Joachim Joos, Gerlingen (DE); Walter Von Emden, Eningen Unter Achalm (DE)

(73) Assignee: ROBERT BOSCH GMBH, Stuttgart (DE)

( * ) Notice: Subject to any disclaimer, the term of this patent is extended or adjusted under 35 U.S.C. 154(b) by 693 days.

(21) Appl. No.: 18/154,265

(22) Filed: Jan. 13, 2023

(65) Prior Publication Data

US 2023/0231210 A1 Jul. 20, 2023

(30) Foreign Application Priority Data

Jan. 14, 2022 (DE) ...................... 10 2022 200 344.6

(51) Int. Cl.
H01M 10/48 (2006.01)
G01R 31/3842 (2019.01)
(Continued)

(52) U.S. Cl.
CPC ...... H01M 10/482 (2013.01); G01R 31/3842 (2019.01); H01M 50/51 (2021.01); H02J 7/575 (2026.01)

(58) Field of Classification Search
CPC .. H01M 10/482; H01M 50/51; H01M 10/425; H01M 2010/4271; H01M 10/42;
(Continued)

(56) References Cited

U.S. PATENT DOCUMENTS 10,629,964 B2 * 4/2020 Swaminathan ........... B60L 3/12
12,062,815 B2 * 8/2024 Muenzel .............. H02J 7/0047
(Continued)

FOREIGN PATENT DOCUMENTS

DE 102010053942 A1 6/2011
DE 102012013890 A1 1/2014
(Continued)

OTHER PUBLICATIONS

Y. Zhu, W. Zhang, J. Cheng and Y. Li, "A novel design of reconfigurable multicell for large-scale battery packs," 2018 International Conference on Power System Technology (POWERCON), Guangzhou, China, 2018, pp. 1445-1452 (Year: 2018).*

*Primary Examiner* — M Baye Diao
(74) *Attorney, Agent, or Firm* — NORTON ROSE FULBRIGHT US LLP

(57) ABSTRACT

A battery and a battery system including such a battery. The battery includes: a first and a second battery cell arrangement, each including at least one battery cell, a first switch, and a second switch, and an evaluation unit. In each battery cell arrangement, the first switch is connected in series to the battery cell of the battery cell arrangement and the second switch is connected in parallel to the series connection made up of the battery cell and its associated first switch. The battery cell arrangements are connected in series. The evaluation unit is configured to activate the switches of a particular battery cell arrangement independently of the switches of particular other battery cell arrangements.

10 Claims, 2 Drawing Sheets

(51) Int. Cl.
   *H01M 50/51*          (2021.01)
   *H02J 7/50*           (2026.01)
(58) Field of Classification Search
   CPC .. H01M 50/50; G01R 31/3842; H02J 7/0024;
      H02J 7/0014; H02J 7/0016; H02J 7/0019;
         H02J 7/0048; H02J 7/0025; H02J
      7/00309; H02J 7/0047; H02J 7/00714;
         H02J 7/007182; H02J 7/007192
   USPC ......................................................... 320/121
   See application file for complete search history.

(56)                   References Cited

U.S. PATENT DOCUMENTS

| | | | |
|---|---|---|---|
| 12,301,040 B2 * | 5/2025 | Petrakivskyi ....... | H02J 7/00712 |
| 2015/0108949 A1 * | 4/2015 | Averitt ................... | B60L 58/20 |
| | | | 320/117 |
| 2018/0136284 A1 * | 5/2018 | Mayer ................... | G01R 31/382 |
| 2018/0170205 A1 | 6/2018 | Yoon | |
| 2021/0328272 A1 * | 10/2021 | Von Emden ........ | H01M 10/486 |
| 2022/0224124 A1 * | 7/2022 | Liang ................... | H02J 7/0016 |
| 2022/0231516 A1 * | 7/2022 | Trela ................... | H02J 7/0048 |
| 2022/0268848 A1 * | 8/2022 | Hong ................... | H01M 10/425 |

FOREIGN PATENT DOCUMENTS

| | | | | |
|---|---|---|---|---|
| DE | 102014200640 A1 * | 7/2015 | ......... | H01M 10/486 |
| DE | 102014110410 A1 | 1/2016 | | |
| DE | 102020108053 A1 | 9/2021 | | |
| JP | 2014514899 A * | 6/2014 | ............... | H02J 7/00 |
| WO | WO-2013139549 A1 * | 9/2013 | ............. | B60L 58/18 |

* cited by examiner

80 battery cell arrangement

30

54

52

50 evaluation unit

45

54

40

40

85

BATTERY AND ENERGY SYSTEM INCLUDING SUCH A BATTERY

FIELD

The present invention relates to a battery and an energy system including such a battery.

BACKGROUND INFORMATION

Some batteries of the related art monitor states of the battery or its battery cells with the aid of a central battery management system and suitable sensors. In this case, for example, voltages, currents, pressures, and temperatures of the battery are monitored.

Such monitoring actions generally take place in the related art with respect to an entirety and/or a larger grouping (modules) of battery cells of the battery permanently interconnected with one another.

Furthermore, some energy systems of the related art are made up of multiple electrical energy stores for different voltage levels and electrical consumers corresponding to each of these.

SUMMARY

According to a first aspect of the present invention, a battery is provided which includes at least one first battery cell arrangement, one second battery cell arrangement, and at least one evaluation unit. The battery according to the present invention is fundamentally a battery usable in any areas of application. It is particularly advantageously usable, for example, as a traction battery of an electrically drivable vehicle (e.g., passenger vehicle, truck, electric bus, electric shuttle, etc.).

According to an example embodiment of the present invention, each of the battery cell arrangements includes at least one battery cell, a first switch, and a second switch. The first and second switches represent logical switches in this case, which are assembled in specific embodiments, for example, of one or multiple physical switches (for example in the form of a "back-to-back" arrangement made up of two semiconductor switches in each case). One specific embodiment of the switches is furthermore not restricted to a certain switch type or to a certain switch technology, so that the switches may be designed, for example, as electronic switches such as MOSFETs, Si-MOSFETs, SiC-MOSFETs, etc. and/or as electromechanical switches such as contactors, relays, or switches differing therefrom. It is moreover possible that the particular first switches and second switches represent switch types identical to one another or differing from one another.

The at least one battery cell contains the actual electrical energy store and is also not restricted to a certain design (e.g., round cell, prismatic cell, pouch cell, etc.) and/or technology (e.g., lithium-ion cells, lead cells, etc.).

The above-mentioned components of the particular battery cell arrangements are preferably each arranged completely or partially in a and/or at a housing of a particular battery cell arrangement, without thus being restricted to such a type of the arrangement.

The evaluation unit is designed, for example, as an ASIC, FPGA, processor, digital signal processor, microcontroller, analog circuit, discrete and/or integrated circuit, or the like.

According to an example embodiment of the present invention, in each battery cell arrangement, the particular first switch is connected in series to the battery cell of the battery cell arrangement, while the particular second switch is connected in parallel to the series connection made up of the battery cell and its particular associated first switch. Furthermore, the particular battery cell arrangements are connected in series to one another.

The at least one evaluation unit of the battery is IT-connected to particular control inputs of the first and second switches and it is configured in this way to activate the switches of a particular battery cell arrangement independently of the switches of particular other battery cell arrangements. An activation of the first switch and the second switch within a battery cell arrangement is preferably also possible independently of one another.

According to an example embodiment of the present invention, the evaluation unit is additionally configured to activate the first switch of a particular battery cell arrangement to close and to activate the second switch of the particular battery cell arrangement to open in order to use the at least one battery cell of the particular battery cell arrangement actively within the battery. In other words, due to such an activation, the at least one battery cell is actively connected in series to the battery cells of further battery cell arrangements of the battery and in this way contributes to a total voltage and a total capacity of the battery.

The evaluation unit is furthermore configured to activate the first switch of a particular battery cell arrangement to open and to activate the second switch of the particular battery cell arrangement to close in order to electrically disconnect the at least one battery cell of the particular battery cell arrangement from the particular other battery cell arrangements of the battery and in order to bypass this battery cell arrangement with respect to the series connection made up of the battery cell arrangements. In other words, the at least one battery cell of the particular battery cell arrangement in the state of such an activation of the switches by the evaluation unit does not contribute to a total voltage and to a total capacity of the battery.

The above configuration offers the advantage according to the present invention that all battery cell arrangements of the battery may be added individually to a group of battery cell arrangements forming the battery and may be disconnected therefrom. In addition to a very flexible interconnection possibility of battery cell arrangements, which results, inter alia, in a very flexible adaptation possibility of such a battery to different usage scenarios, numerous further advantages may be achieved by a use of a battery configured in such a way, which are explained in greater detail in the following description of advantageous embodiments of the present invention.

It is to be noted that the battery preferably has a higher number of battery cell arrangements than the above-described two battery cell arrangements. A number of battery cell arrangements connected in series of the battery is, for example, greater than 10, greater than 50, or greater than 100, without thus restricting a usable number of battery cell arrangements.

Preferred refinements and embodiments of the present invention are disclosed herein.

In one advantageous example embodiment of the present invention, the evaluation unit is configured to ascertain a state of the first battery cell arrangement and a state of the second battery cell arrangement and to activate the first switch of those battery cell arrangements to close and to activate the second switch of those battery cell arrangements to open, whose ascertained state does not represent an error state. Moreover, the evaluation unit is configured to activate the first switch of those battery cell arrangements to open and to activate the second switch of those battery cells to close, whose ascertained state represents an error state. A particular error state is ascertained, for example, on the basis of a sensor system IT-connected to the evaluation unit, which preferably detects a current flowing through the battery cell arrangement and/or a voltage dropping across the battery and/or the battery cell arrangement and/or a temperature of the battery cell and/or a pressure within the battery cell. Short-circuits and/or impermissibly high temperatures and/or pressures and/or impermissibly high impedances of the battery cell arrangement, etc., for example, may be ascertained as error states therefrom. In addition, it is also possible to monitor switching states of the first switch and/or the second switch and/or particular temperatures of the two switches. If, for example, an error state of the first switch is ascertained (for example, overheating and/or an incorrect switching state with respect to an activation), it is possible, for example, to close the affected battery cell arrangement regardless of an actual switching state of the first switch, in order to bypass the affected battery cell arrangement in the series connection. Alternatively or additionally, it is also possible to receive error states from a component situated outside the battery according to the present invention (which represent, for example, error states of the battery and/or the battery cell arrangement) and in response to particular error states to carry out a predefined activation of the first and second switches of the particular battery cell arrangement.

A number of particular battery cell arrangements connected in series of the battery is particularly advantageously greater by at least one than is required for a (minimum) output voltage and/or (minimum) capacity and/or (minimum) output power to be provided by the battery. It is to be noted that the above-mentioned requirements for the battery may be predefined requirements or dynamically established requirements which are ascertained, for example, during running operation of the battery as a function of presently existing load situations, etc. Such a redundant design of battery cell arrangements offers the advantage that decoupling of individual battery cell arrangements from the series connection of battery cell arrangements, for example, in response to an occurrence of an error state within a battery cell arrangement, is possible without problems without thus exerting a negative influence on a load supplied by the battery according to the present invention. The battery advantageously has a higher number of redundant battery cell arrangements, so that a correspondingly higher number of battery cell arrangements may be deactivated without influence on a load to be operated. In correct operation of all battery cell arrangements, such a number of battery cell arrangements is preferably deactivated within the series connection in each case which corresponds to the number of redundant battery cell arrangements, this not being supposed to define a strict restriction with respect to active and inactive battery cell arrangements. In other words, such a redundant arrangement of battery cell arrangements offers a particularly high level of failure protection of the battery, since error states in individual battery cell arrangements do not necessarily result in a failure of the entire battery and/or entire modules of the battery. Moreover, it is to be noted that one or multiple redundant battery cell arrangements do not necessarily have to be fixedly defined battery cell arrangements, rather in principle each of the battery cell arrangements may assume the function of a redundant battery cell arrangement. This takes place, for example, on the basis of a predefined or dynamically ascertained order for activating and deactivating battery cell arrangements, so that the function of the particular redundant battery cell arrangement is associated with different battery cell arrangements in the rotation method, for example. It is also explicitly possible as a function of a number of redundant battery cell arrangements to decouple more than one battery cell arrangement from the series connection at the same time.

As mentioned above, it is possible that the battery cell arrangements each include precisely one battery cell or at least two battery cells connected in parallel and/or two battery cells connected in series. It is moreover possible that different battery cell arrangements of the battery include different configurations of battery cells.

In another advantageous embodiment of the present invention, each battery cell arrangement includes a separate evaluation unit, which is provided for activating the first switches and second switches of the particular battery cell arrangements and which is configured in particular to communicate with a higher-order central control unit, for example of a battery management system. This offers the advantage, inter alia, that processing of results of voltage and/or current and/or temperature and/or pressure measurements within a particular battery cell arrangement may be carried out directly in the battery cell arrangement itself, due to which, for example, a processing speed may be increased in comparison to the related art. Moreover, it is possible in this way to allocate a processing load onto the individual evaluation units of the particular battery cell arrangements and onto a possibly provided central control unit, due to which more cost-effective processing units are usable within the evaluation units and/or within the central control unit. Moreover, a reaction speed to particular measurement results may be increased, since they do not have to first be transferred (possibly sequentially) to a central control unit, in particular in time-critical situations. In particular, in conjunction with established error states within the particular battery cell arrangements, a local execution of an error reaction within the battery cell arrangement is thus possible by way of the particular evaluation unit. It is to be noted that a communication connection (for example, a bus connection or a connection differing therefrom) is possible not only between the individual evaluation units and a possibly provided central control unit, but rather the individual evaluation units may also have direct communication connections among one another.

In one particularly advantageous example embodiment of the present invention, the evaluation unit is configured to additionally use the activation and the bypassing of battery cells of the battery cell arrangements among each other for balancing of the battery cells (i.e., for adjusting particular states of charge) and/or for standardizing a load of the battery cells (for example, a temperature load over time). To achieve an adjustment of states of charge of particular battery cells of the battery cell arrangements, for example, those battery cell arrangements whose associated battery cells have a higher state of charge than the battery cells of other battery cell arrangements are decoupled in an above-described rotation method for decoupling battery cell arrangements at a greater frequency from the group made up of battery cell arrangements, in order to effectuate a higher level of energy withdrawal from the more strongly charged battery cells over time. An order and/or a frequency and/or a duration of particular decoupling actions of battery cell arrangements is advantageously established as a function of a level of a particular state of charge of the battery cells. A similar procedure may be used, for example, to equalize deviating temperatures between battery cells, in that those battery cell arrangements are decoupled more frequently and/or longer whose associated battery cells have a higher temperature than the battery cells of other battery cell arrangements. This is advantageous in particular if sufficiently uniform cooling of all battery cells is not achievable with the aid of a (simple) cooling system due to their particular arrangement positions within the battery. The battery according to the present invention accordingly offers the advantage that states of individual battery cell arrangements may be adjusted to one another in a particularly flexible manner and in particular during running operation in a simple manner.

In a further particularly advantageous example embodiment of the present invention, the evaluation unit is configured to provide in successive time periods in each case a first output voltage and a second output voltage, differing from the first output voltage, of the battery, in that with the aid of an activation of particular first switches and particular second switches, alternately a first number and a second number, differing from the first number, of battery cells of the battery cell arrangements is switched active, while the particular other battery cells of the battery cell arrangements are bypassed. It is to be noted that more than two different output voltages may also be provided in this way. Preferably, particular combinations of active battery cell arrangements for generating the particular output voltages alternate over time, so that an essentially uniform discharge and/or load of the individual battery cells takes place. In other words, in the course of providing different output voltages on the basis of suitable activations and deactivations of battery cell arrangements, balancing and/or temperature adjustment and/or an adjustment and/or monitoring of further states of the battery cells may be achieved at the same time. The advantageous embodiment of the present invention described here permits in summary a particularly simple, efficient, and flexible provision of different voltage levels on the basis of a single battery without additional components such as DC/DC converters, etc. being necessary. In this way, for example, a combined application of a first battery for a first voltage level and a second battery for a second voltage level, as is to be encountered, for example, in vehicles in the form of a 12 V battery and a 48 V battery and/or a high-voltage battery, may be replaced by a single battery according to the present invention.

This enables, for example, a reduction in costs and/or installation space and/or weight.

The battery according to an example embodiment of the present invention advantageously furthermore includes a third switch, a fourth switch, a first capacitor, and a second capacitor, a series connection made up of the third switch and the first capacitor being connected in parallel to the series connection made up of the battery cell arrangements of the battery and a series connection made up of the fourth switch and the second capacitor being connected in parallel to the series connection made up of the battery cell arrangements of the battery. The third switch and the fourth switch are, for example, also designed as electronic switches such as MOSFETs, Si-MOSFETs, SiC-MOSFETs, etc. and/or as electromechanical switches such as contactors, relays, or switches differing therefrom. The evaluation unit is configured here at the beginning of a first time period to set the first output voltage of the battery, to close the third switch and open the fourth switch, so that the first capacitor is charged with the aid of the first output voltage. The evaluation unit is furthermore configured at the beginning of a second time period following the first time period to set the second output voltage of the battery, to open the third switch and close the fourth switch, so that the second capacitor is charged with the aid of the second output voltage. The first capacitor and the second capacitor, which are designed, for example, as super capacitors or capacitors differing therefrom, are each used to buffer electrical energy, since in principle there is no permanent electrical connection between the particular capacitors and the battery.

According to a second aspect of the present invention, an energy system is provided. According to an example embodiment of the present invention, the energy system includes: a battery according to the preceding description, a first consumer, and a second consumer, the first consumer being designed for the first output voltage and being configured to be electrically connected to the first capacitor and to consume electrical energy stored in the first capacitor and the second consumer being designed for the second output voltage and being configured to be electrically connected to the second capacitor and to consume electrical energy stored in the second capacitor. The features, combinations of features, and advantages resulting therefrom clearly correspond to the statements made in conjunction with the first-mentioned aspect of the present invention in such a way that reference is made to the above statements to avoid repetitions.

In one advantageous example embodiment of the energy system according to the present invention, a particular duration and/or a particular repetition cycle of the first time period and the second time period is established and/or adapted as a function of a particular energy consumption by the first consumer and the second consumer. In this way, the battery according to the present invention may be adapted optimally in each case to different energy demands of different consumers.

BRIEF DESCRIPTION OF THE DRAWINGS

Exemplary embodiments of the present invention are described in detail hereinafter with reference to the figures.

FIG. 1 shows a schematic view of one specific example embodiment of a battery according to the present invention.

DETAILED DESCRIPTION OF EXAMPLE EMBODIMENTS

Figure 1:
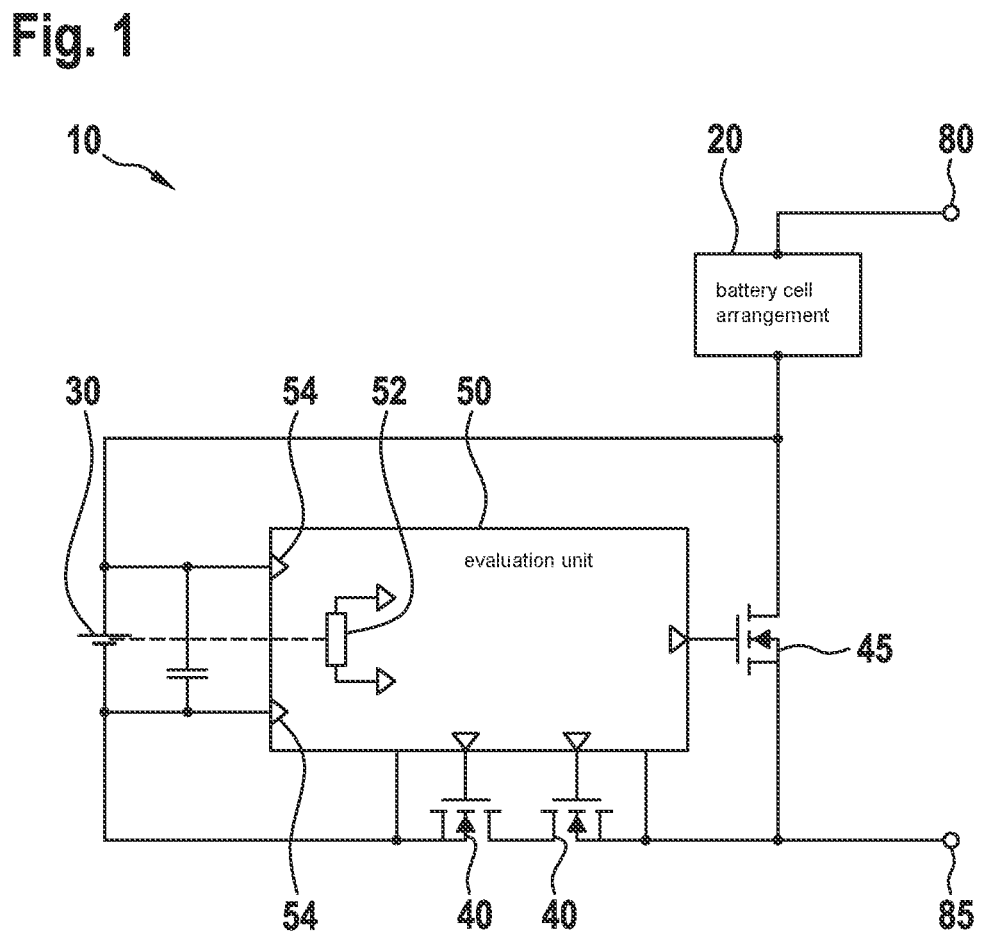
Figure 2:
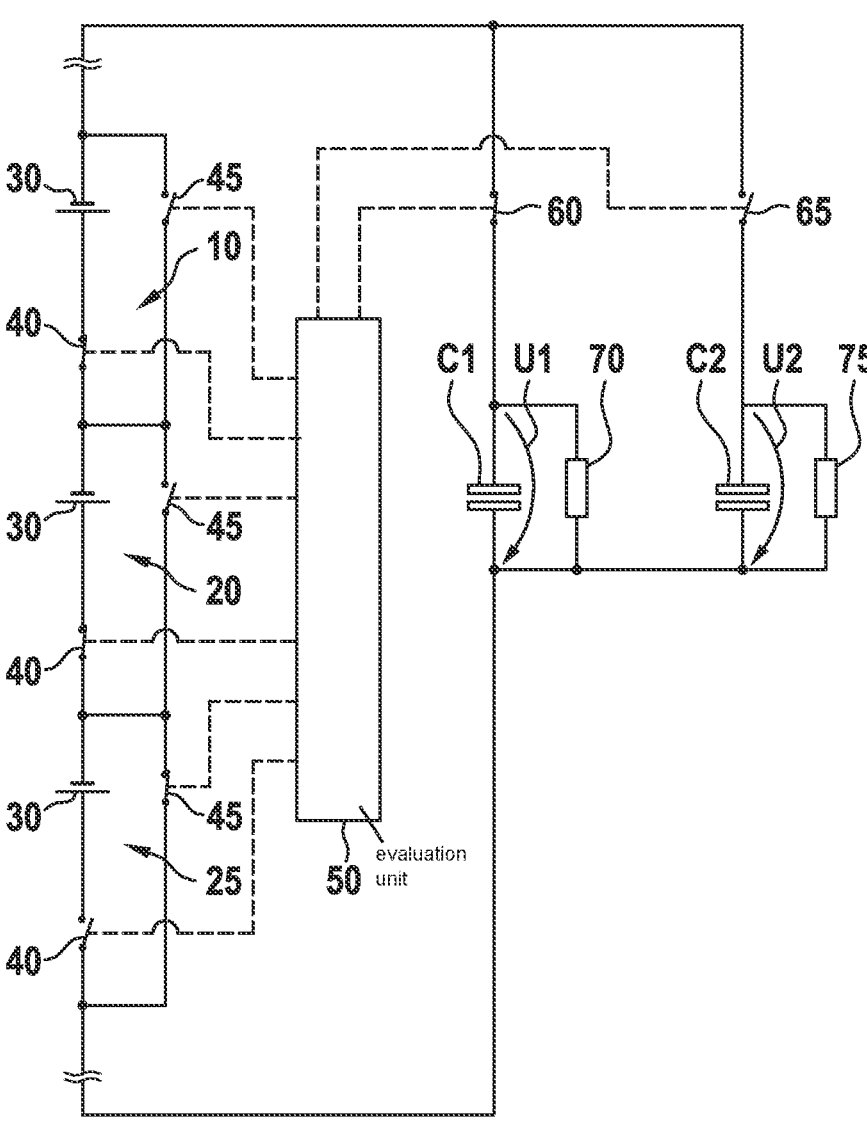
FIG. 2 shows a schematic view of one specific example embodiment of an energy system according to the present invention.

FIG. 1 shows a schematic view of one specific embodiment of a battery according to the present invention. The battery includes a large number of battery cell arrangements 10, 20 connected in series, of which a first battery cell arrangement 10 and a second battery cell arrangement 20 are shown here by way of example. Since battery cell arrangements 10, 20 are formed identically here, only first battery cell arrangement 10 is shown in detail and only first battery cell arrangement 10 will be described in detail as a representative hereinafter to avoid repetitions.

First battery cell arrangement 10 includes a battery cell 30, which represents an electrical energy store of the battery, a first switch 40, which is a logical switch and is formed from two semiconductor switches in a so-called "back-to-back" arrangement, a second switch 45, which is formed from a single semiconductor switch, and an evaluation unit 50, which is formed here as an ASIC. First switch 40 is connected in series to battery cell 30, while second switch 45 is connected in parallel to the series connection made up of first switch 40 and battery cell 30.

Evaluation unit 50 is electrically connected to particular control inputs of first switch 40 and second switch 45 and is configured in this way to electrically incorporate first battery cell arrangement 10 into the series connection of battery cell arrangements 10, 20 by closing first switch 40 and by opening second switch 45 and to electrically decouple first battery cell arrangement 10 from the series connection of battery cell arrangements 10, 20 by opening first switch 40 and by closing second switch 45.

First battery cell arrangement 10 moreover includes a temperature sensor 52 and a voltage sensor 54, via which evaluation unit 50 is additionally configured to monitor a state of battery cell 30 and in the case of an existing error state to electrically decouple first battery cell arrangement 10 from the series connection of battery cell arrangements 10, 20.

Via a first battery terminal 80 and a second battery terminal 85, the battery is configured to provide electrical energy stored in the battery and/or to accept and store electrical energy provided externally via battery terminals 80, 85.

Evaluation unit 50 is furthermore configured to carry out balancing, i.e., a state of charge adjustment of battery cells 30 of the battery with the aid of a suitable activation of particular first switches 40 and second switches 45, in that all battery cell arrangements 10, 20 are electrically decoupled sequentially and repeatedly from the series connection of battery cell arrangements 10, 20 and depending on the state of charge of particular battery cells 30 of battery cell arrangements 10, 20 remain in the decoupled state for different lengths of time.

Particular evaluation units 50 of battery cell arrangements 10, 20 are preferably configured to communicate with a battery management system (not shown), in order to transfer internal states to the battery management system and to receive higher-order action instructions from the battery management system.

FIG. 2 shows a schematic view of one specific embodiment of an energy system according to the present invention, the energy system being part of a low-voltage vehicle electrical system of a vehicle here. The energy system includes a battery including a large number of battery cell arrangements 10, 20, 25, of which three battery cell arrangements 10, 20, 25 are shown here by way of example. Each battery cell arrangement 10, 20, 25 includes a battery cell 30, a first switch 40, and a second switch 45. Particular switches 40, 45 are electrically connected to a central evaluation unit 50 of the battery, formed as an ASIC, and in this way are configured to be activated by evaluation unit 50. Alternatively, it is possible that the activation takes place via separate evaluation units 50 in each case, which may be situated in each battery cell arrangement 10, 20, 25 of the battery.

Evaluation unit 50 is configured to provide in successive time periods in each case a first output voltage U1, here at the level of 12 V, and a second output voltage U2 differing from first output voltage U1, here at the level of 48 V, of the battery, in that alternately a first number and the second number, differing from the first number, of battery cells 30 of battery cell arrangements 10, 20, 25 are switched active with the aid of an activation of particular first switches 40 and particular second switches 45, while particular other battery cells 30 of battery cell arrangements 10, 20, 25 are bypassed.

Furthermore, in this specific embodiment of the energy system according to the present invention, a series connection made up of a third switch 60 and a first capacitor C1 is connected in parallel to the series connection made up of battery cell arrangements 10, 20, 25 of the battery, while a series connection made up of a fourth switch 65 and a second capacitor C2 is connected in parallel to the series connection made up of battery cell arrangements 10, 20, 25 of the battery.

Evaluation unit 50 is configured, at the beginning of a particular first time period, to set first output voltage U1 of the battery, to close third switch 60, and to open fourth switch 65, so that first capacitor C1 is charged with the aid of first output voltage U1. A first consumer 70, which is designed for a voltage of 12 V, is electrically connected to first capacitor C1 and is configured to consume electrical energy stored in first capacitor C1.

Evaluation unit 50 is furthermore configured, at the beginning of a second time period following the first time period, to set second output voltage U2 of the battery, to open third switch 60, and to close fourth switch 65, so that second capacitor C2 is charged with the aid of second output voltage U2. A second consumer 75, which is designed for a voltage of 48 V, is electrically connected to second capacitor C2 and is configured to consume electrical energy stored in second capacitor C2.

A particular duration and/or a particular repetition cycle of the first time period and the second time period are advantageously established and adapted as a function of a particular energy consumption by first consumer 70 and second consumer 75.

What is claimed is:

1. A battery, comprising:
   at least one first battery cell arrangement and one second battery cell arrangement, each of the first battery cell arrangement and the second battery cell arrangement including at least one battery cell, a first switch, and a second switch; and
   at least one evaluation unit;
   wherein, in each battery cell arrangement of the first battery cell arrangement and the second battery cell arrangement:
      the first switch of the battery cell arrangement is connected in series to the battery cell of the battery cell arrangement, and
      the second switch of the battery cell arrangement is connected in parallel to the series connection made up of the battery cell of the battery cell arrangement and the first switch of the battery cell arrangement;
   wherein the first battery cell arrangement and the second battery cell arrangement are connected to each other in series; and
   wherein the evaluation unit is configured to:
      activate the first and second switches of each of the first and second battery cell arrangements independently of the first and second switches of the other of the first and second battery cell arrangements,
      activate the first switch of a particular battery cell arrangement of the first and second battery cell arrangements to close and the second switch of the particular battery cell arrangement to open, to use the at least one battery cell of the particular battery cell arrangement actively within the battery, and
      activate the first switch of the particular battery cell arrangement to open and the second switch of the particular battery cell arrangement to close, to electrically disconnect the at least one battery cell of the particular battery cell arrangement from the others of the battery cell arrangements and in order to bypass the particular battery cell arrangement with respect to the series connection made up of the first and second battery cell arrangements, wherein the battery includes at least one redundant battery cell arrangement connected in series with the first and second battery cell arrangements, and wherein the evaluation unit is configured to dynamically assign one or more of the battery cell arrangements as redundant, and to bypass the assigned redundant battery cell arrangements.

2. The battery as recited in claim 1, wherein the evaluation unit is configured to:

ascertain a state of the first battery cell arrangement and a state of the second battery cell arrangement, activate the first switch of those of the first battery cell arrangement and the second battery cell arrangement to close and the second switch of those of the first battery cell arrangement and the second battery cell arrangement to open, whose ascertained state does not represent an error state, and activate the first switch of those of the first battery cell arrangement and the second battery cell arrangement to open and the second switch of those of the first battery cell arrangement and second battery cell arrangement to close, whose ascertained state represents an error state.

3. The battery as recited in claim 1, wherein a number of battery cell arrangements of the battery connected in series is greater by at least one than is required for an output voltage and/or capacity and/or output power to be provided by the battery.

4. The battery as recited in claim 1, wherein each of the first battery cell arrangement and the second battery cell arrangement includes:

(i) precisely one battery cell, or (ii) at least two battery cells connected in parallel and/or two battery cells connected in series.

5. The battery as recited in claim 1, wherein each battery cell arrangement of the first battery cell arrangement and the second battery cell arrangement includes a separate evaluation unit which is provided to activate the first switch and second switch of the battery cell arrangement.

6. The battery as recited in claim 1, wherein the evaluation unit is configured to use the activation and the bypassing of battery cells of the first and second battery cell arrangements to balance the battery cells and/or to standardize a load of the battery cells among one another.

7. The battery as recited in claim 1, wherein the evaluation unit is configured to, in successive time periods, provide in each case a first output voltage and a second output voltage, differing from the first voltage, of the battery, in that alternately a first number and a second number, differing from the first number, of battery cells of the first and second battery cell arrangements is switched active using activation of the first switches and second switches of the first and second battery cell arrangements, while the particular other battery cells of the first and second battery cell arrangements are bypassed.

8. A battery, comprising:

at least one first battery cell arrangement and one second battery cell arrangement, each of the first battery cell arrangement and the second battery cell arrangement including at least one battery cell; a first switch; a second switch; a third switch; a fourth switch; a first capacitor; and a second capacitor; and at least one evaluation unit;

wherein, in each battery cell arrangement of the first battery cell arrangement and the second battery cell arrangement:

the first switch of the battery cell arrangement is connected in series to the battery cell of the battery cell arrangement, and the second switch of the battery cell arrangement is connected in parallel to the series connection made up of the battery cell of the battery cell arrangement and the first switch of the battery cell arrangement;

wherein the first battery cell arrangement and the second battery cell arrangement are connected to each other in series; and wherein the evaluation unit is configured to:

activate the first and second switches of each of the first and second battery cell arrangements independently of the first and second switches of the other of the first and second battery cell arrangements, activate the first switch of a particular battery cell arrangement of the first and second battery cell arrangements to close and the second switch of the particular battery cell arrangement to open, to use the at least one battery cell of the particular battery cell arrangement actively within the battery, and activate the first switch of the particular battery cell arrangement to open and the second switch of the particular battery cell arrangement to close, to electrically disconnect the at least one battery cell of the particular battery cell arrangement from the others of the battery cell arrangements and in order to bypass the particular battery cell arrangement with respect to the series connection made up of the first and second battery cell arrangements, wherein the evaluation unit is configured to, in successive time periods, provide in each case a first output voltage and a second output voltage, differing from the first voltage, of the battery, in that alternately a first number and a second number, differing from the first number, of battery cells of the first and second battery cell arrangements is switched active using activation of the first switches and second switches of the first and second battery cell arrangements, while the particular other battery cells of the first and second battery cell arrangements are bypassed, wherein:

a series connection made up of the third switch and the first capacitor is connected in parallel to the series connection made up of the first and second battery cell arrangements of the battery, a series connection made up of the fourth switch and the second capacitor is connected in parallel to the series connection made up of the first and second battery cell arrangements of the battery, and the evaluation unit is configured to:

at the beginning of a first time period, set the first output voltage of the battery, close the third switch, and to open the fourth switch, so that the first capacitor is charged using the first output voltage, at the beginning of a second time period, following the first time period, set the second output voltage of the battery, open the third switch, and close the fourth switch, so that the second capacitor is charged using the second output voltage.

9. An energy system, comprising:

a battery, including:

at least one first battery cell arrangement and one second battery cell arrangement, each of the first battery cell arrangement and the second battery cell arrangement including at least one battery cell, a first switch, and a second switch;

a third switch;

a fourth switch;

a first capacitor;

a second capacitor; and at least one evaluation unit;

a first consumer; and a second consumer;

wherein, in each battery cell arrangement of the first battery cell arrangement and the second battery cell arrangement:

the first switch of the battery cell arrangement is connected in series to the battery cell of the battery cell arrangement, and the second switch of the battery cell arrangement is connected in parallel to the series connection made up of the battery cell of the battery cell arrangement and the first switch of the battery cell arrangement;

wherein the first battery cell arrangement and the second battery cell arrangement are connected to each other in series, and wherein the evaluation unit is configured to:

activate the first and second switches of each of the first and second battery cell arrangements independently of the first and second switches of the other of the first and second battery cell arrangements, activate the first switch of a particular battery cell arrangement of the first and second battery cell arrangements to close and the second switch of the particular battery cell arrangement to open, to use the at least one battery cell of the particular battery cell arrangement actively within the battery, activate the first switch of the particular battery cell arrangement to open and the second switch of the particular battery cell arrangement to close, to electrically disconnect the at least one battery cell of the particular battery cell arrangement from the others of the battery cell arrangements and in order to bypass the particular battery cell arrangement with respect to the series connection made up of the first and second battery cell arrangements, in successive time periods, provide in each case a first output voltage and a second output voltage, differing from the first voltage, of the battery, in that alternately a first number and a second number, differing from the first number, of battery cells of the first and second battery cell arrangements is switched active using activation of the first switches and second switches of the first and second battery cell arrangements, while the particular other battery cells of the first and second battery cell arrangements are bypassed;

wherein:

a series connection made up of the third switch and the first capacitor is connected in parallel to the series connection made up of the first and second battery cell arrangements of the battery, a series connection made up of the fourth switch and the second capacitor is connected in parallel to the series connection made up of the first and second battery cell arrangements of the battery, and the evaluation unit is configured to:

at the beginning of a first time period, set the first output voltage of the battery, close the third switch, and to open the fourth switch, so that the first capacitor is charged using the first output voltage, at the beginning of a second time period, following the first time period, set the second output voltage of the battery, open the third switch, and close the fourth switch, so that the second capacitor is charged using the second output voltage, the first consumer is configured for the first output voltage and is configured to be electrically connected to the first capacitor and to consume electrical energy stored in the first capacitor, and the second consumer is configured for the second output voltage and is configured to be electrically connected to the second capacitor and to consume electrical energy stored in the second capacitor.

10. The energy system as recited in claim 9, wherein a particular duration and/or a particular repetition cycle of the first time period and the second time period is established and/or adapted as a function of a particular energy consumption by the first consumer and the second consumer.

* * * * *